(12) United States Patent
Wang

(10) Patent No.: US 6,265,026 B1
(45) Date of Patent: Jul. 24, 2001

(54) VAPOR PHASE DEPOSITION

(75) Inventor: Yuchun Wang, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/298,540

(22) Filed: Apr. 22, 1999

Related U.S. Application Data

(63) Continuation-in-part of application No. 09/007,989, filed on Jan. 16, 1998.

(51) Int. Cl.$^7$ .................................................. C23C 16/455
(52) U.S. Cl. .............................. 427/248.1; 427/255.23; 427/255.25; 427/255.28
(58) Field of Search ..................... 427/255.28, 255.23, 427/255.25, 309, 244, 248.1

(56) References Cited

U.S. PATENT DOCUMENTS

| | | | |
|---|---|---|---|
| 5,090,985 | * 2/1992 | Soubeyrand et al. | 65/60.52 |
| 5,108,792 | * 4/1992 | Anderson et al. . | |
| 5,419,924 | * 5/1995 | Nagashima et al. | 427/248.1 |
| 5,651,900 | 7/1997 | Keller et al. | 216/56 |
| 5,916,359 | * 6/1999 | Baum et al. | 106/287.18 |
| 5,925,189 | * 7/1999 | Nguyen et al. | 118/726 |

OTHER PUBLICATIONS

Sekoguchi et al, Han'guk Pyomyon Konghak Hoechi, 29(6) P. 781–787 (Abstract), 1996.*

Chang et al., "Use of Oxiranes in the Preparation of Bonded Phase Supports," Chromatography, 120, 321–333, 1976.

Jorgenson et al., "Capillary Zone Electrophoresis," Science, vol.222, 266–272, 1983.

Schnabel et al., "Review: Controlled–pore Glass as a Stationary Phase in Chromatography," J. Chromatography, 544, 137–146, 1991.

Gray et al., "Ellipsometric and Interferometric Characterization of DNA Probes Immobilized on a Combinatorial Array," Langmuir, 13, 2833–2842, 1997.

Kittilsland et al., "A Sub–micron Particle Filter in Silicon," Sensors and Actuators, A21–A23, 904–907, 1990.

Tu et al., "Characterization of bulk–micromachined, direct-bonded silicon nanofilters," SPIE Bios '98 Conference, vol.3258, pp. 148–155, 1998.

Brody et al., "Biotechnology at Low Reynolds Numbers," Biophysical Journal, 71, 3430–3441, 1996.

Wilding et al., "Manipulation and Flow of Biological Fluids in Straight channels Micromachined in Silicon," Clinical Chemistry, 40. 43–47, 1994.

Wasserman et al., "Structure and Reactivity of Alkylsiloxane Monolayers Formed by Reaction of Alkyltrichlorosilanes on Silicon Substrates," Langmiur, 5, 1074–1087, 1989.

Ulman, "Formation and Structure of Self–Assembled Monolayers," Chemical Reviews, 96, 1553–1554, 1996.

Maboudian et al., "Critical Review: Adhesion in surface micromechanical structures," J. Vacuum Science and Technology B 15, 1–20, 1997.

(List continued on next page.)

Primary Examiner—Timothy Meeks
(74) Attorney, Agent, or Firm—Fish & Richardson P.C.

(57) ABSTRACT

A method and apparatus for performing vapor phase deposition to form a monolayer coating on the surface of an article. A liquid coating reagent is provided in a flow passageway extending into the process chamber. A carrier gas is flowed through the flow passageway to form a gas mixture including a vaporized coating reagent. The gas mixture is directed into the process chamber to contact the article. The vaporized coating reagent is deposited onto the article to form a coating thereon.

3 Claims, 4 Drawing Sheets

OTHER PUBLICATIONS

Jonsson, et al., "Chemical Vapor Deposition of Silanes," Thin Solid Film, 124, 117–123, 1985.

Hoffmann et al., "Vapor Phase Self–Assembly of Fluorinated Monlayers on Silicon and German Oxide," Langmuir, 13, 1877–1880, 1997.

Duchet et al., "Influence of the Deposition Process on the Structure of Grafted Alkylsilane Layers," Langmuir, 13, 2271–2278, 1997.

Yuchun Wang, "Surface Modification of Pollymeric Membranes and Silicon Filters," Disertation work, UC Berkeley, Fall 1998, 109 pp.

Wang et al., "Vapor phase deposition of uniform and ultrathin silanes", Proceedings of SPIE vol. 3258, SPIE Bios'98, 1998, San Jose, CA, 9 pp.

* cited by examiner

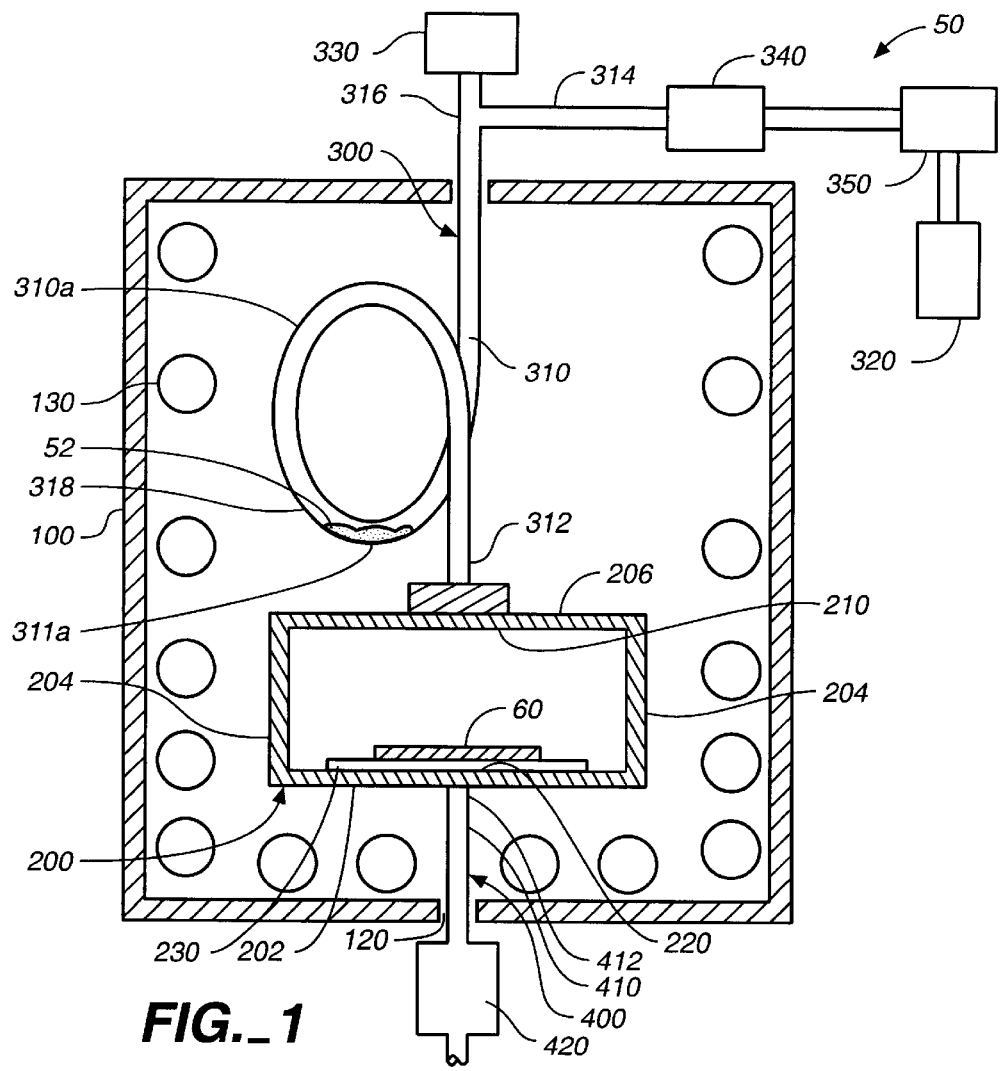
FIG._1
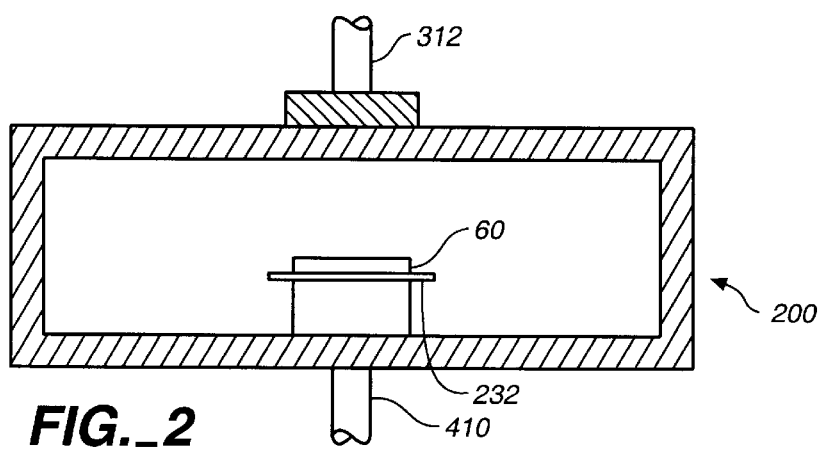
FIG._2

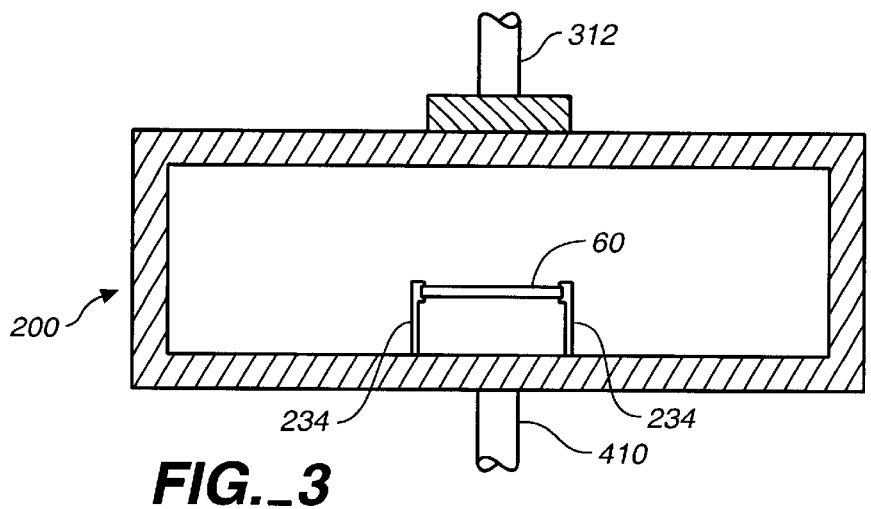
FIG._3
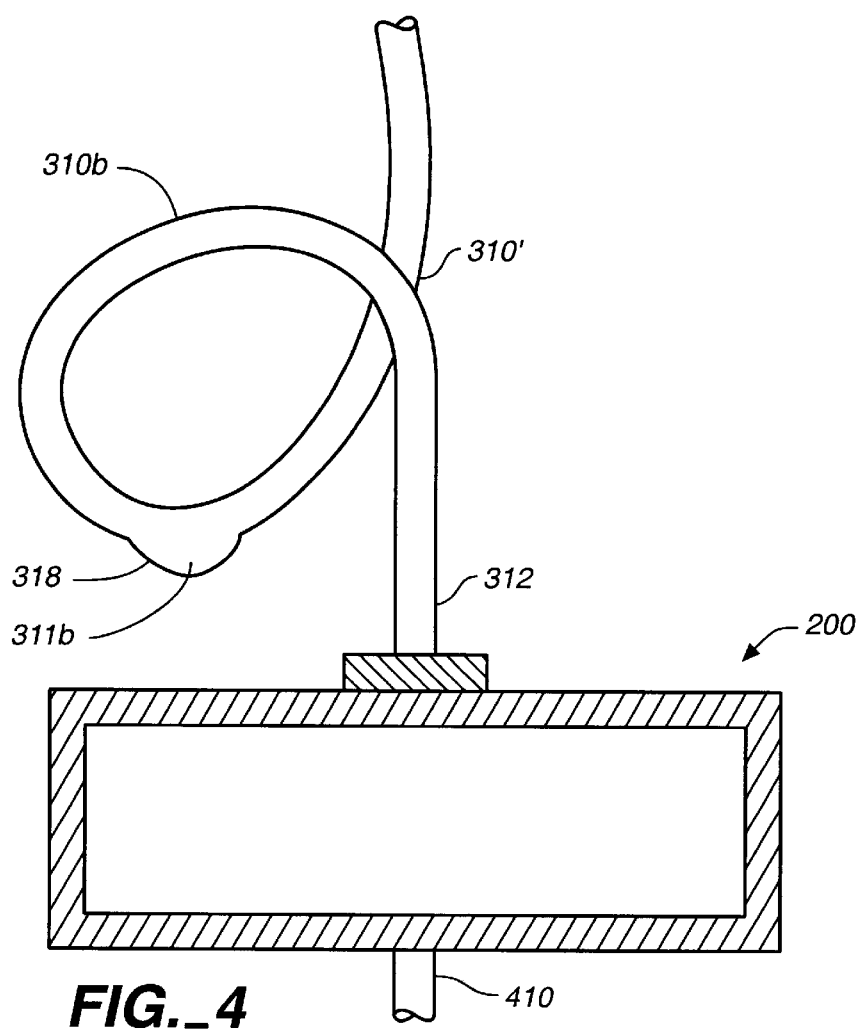
FIG._4

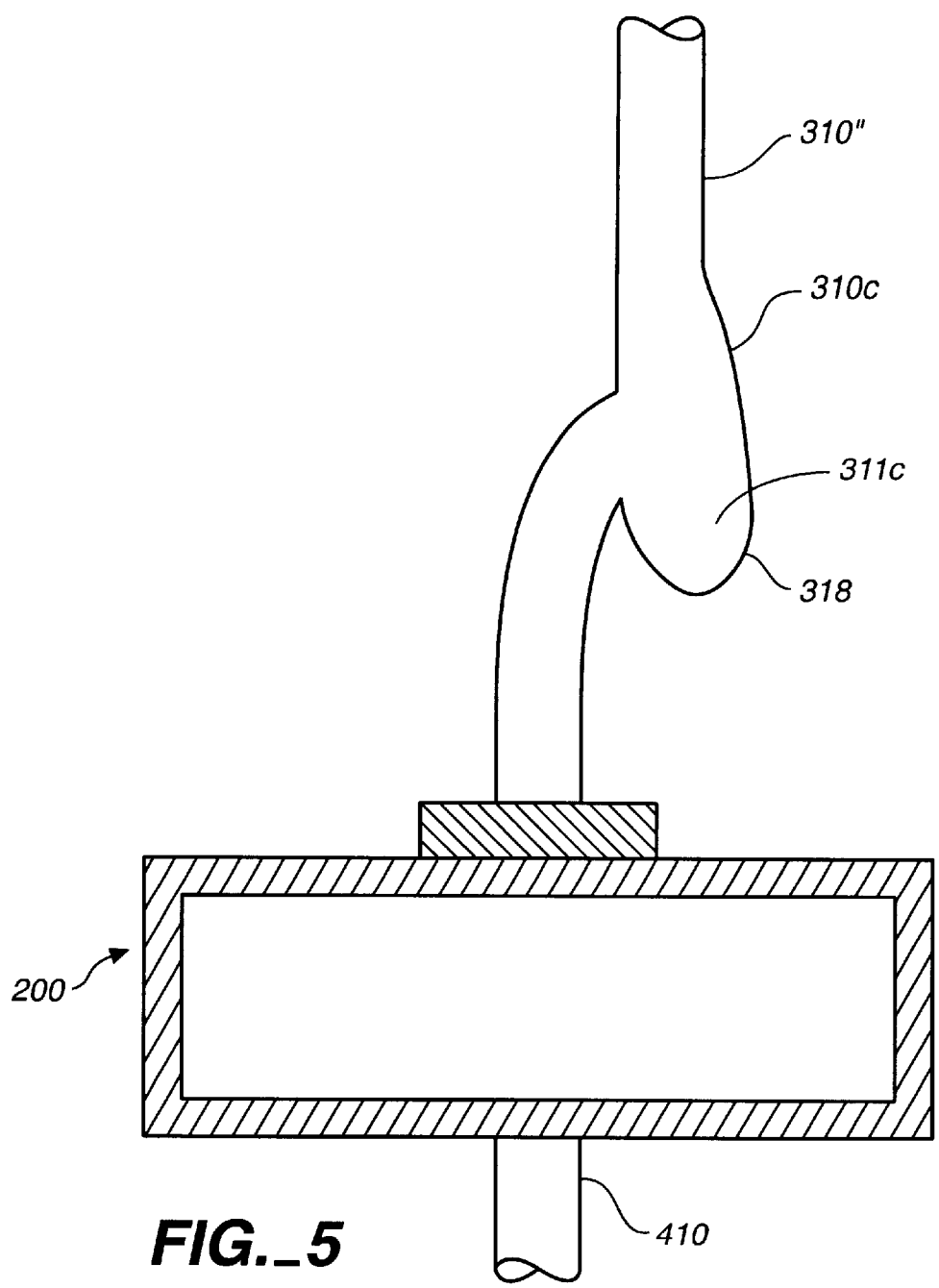
FIG._5

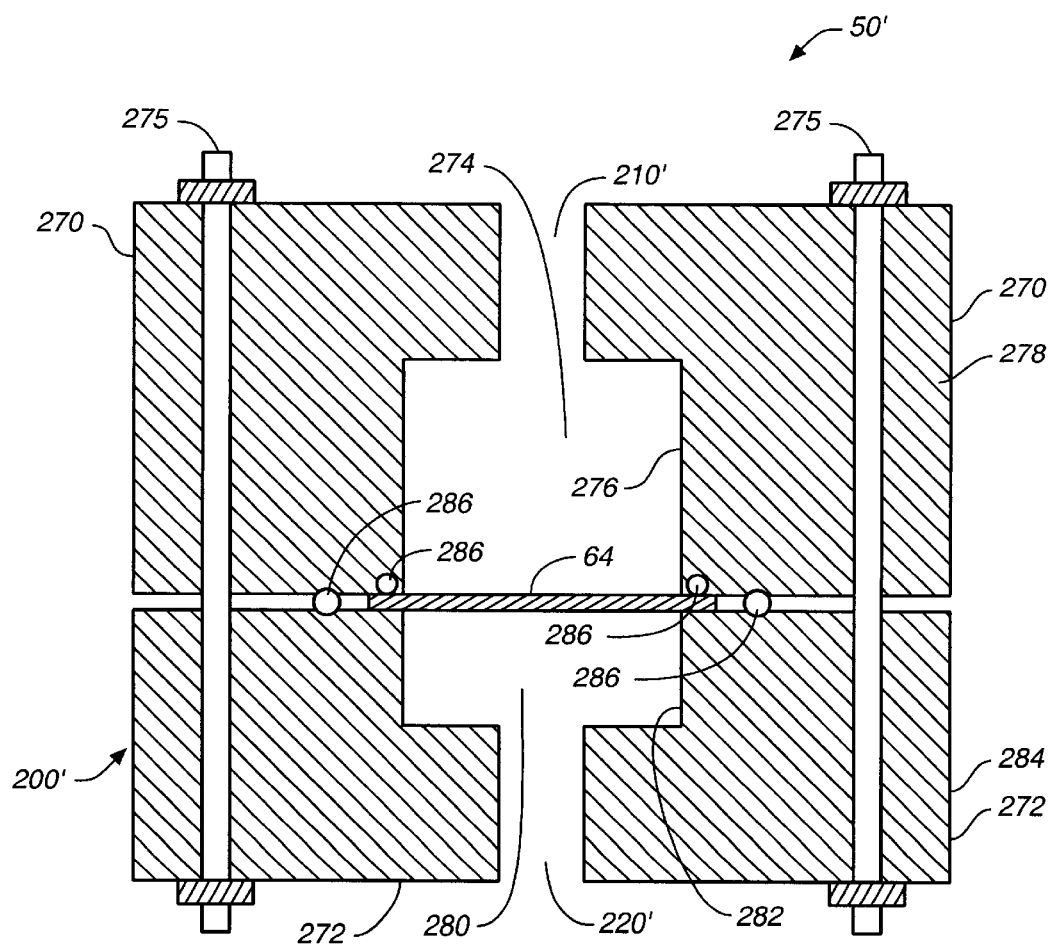
FIG._6

VAPOR PHASE DEPOSITION

CROSS REFERENCE TO RELATED APPLICATION

This is a continuation-in-part of U.S. application Ser. No. 09/007,989, filed Jan. 16, 1998, which is incorporated herein by reference.

BACKGROUND

The present invention relates to vapor phase deposition, and more particularly to vapor phase deposition of coatings.

Uniform and monolayer coatings, such as silanes, on silicon based surfaces are desired for a number of applications. In the micromachining of microelectromechanical system (MEMS), a final hydrophobic coating on the device is needed to prevent adhesion of adjacent surfaces due to capillary forces in water.

In contrast, a hydrophillic coating is desired for silicon based medical devices, such as filters or capsules, that are in contact with protein solutions to regulate hydrophilicity and minimize unspecific protein adsorption.

Currently, the coating methods most often used typically involve the assembly of a silane "monolayer" onto a silicon surface in an organic solution. It is known that alcohol groups, being hydrophilic and neutral, can drastically reduce protein adsorption on the surface of contact lenses, glass membranes, and porous silica. To assemble a monolayer of alcohol groups onto a silicon filter surface for protein ultrafiltration, one step is to coat silicon with vinyltrichlorosilane (VTS) or γ-glycidoxy-propyltrimethoxysilane (GPTMS), then convert the vinyl or epoxide resulting from the initial coating step to alcohol groups. Typical precursor molecules are alkyltrichlorosilanes (denoted as $RSiCl_3$) or alkyltrimethoxysilanes (denoted as $RSi(OCH_3)_3$), where R is any desired functional group to be introduced into the coating. However, trichlorosilanes and trimethoxysilanes are very sensitive to moisture. Even trace amounts of water in the organic solution could lead to polymerization. This causes the formation of multilayers with variable thicknesses, and submicron aggregates or islands on the silicon surface. To avoid this polymerization problem, an alternative method involves the use of monochlorosilane, which is incapable of polymerization. However, monochlorosilanes form a less stable coating than alkyltrichlorosilanes or alkyltrimethoxysilanes.

Another method calls for coating the silanes in a high vacuum. This approach, however, is more expensive than solution coating.

SUMMARY

One aspect of the invention is directed to an apparatus for forming a coating on an article. The apparatus includes a process chamber in which the article is supported; a storage region to contain a liquid coating reagent; an inflow assembly to flow a carrier gas through the storage region to produce a gas mixture including a vaporized coating reagent and the carrier gas, and to direct the gas mixture into the process chamber and onto the article to deposit the vaporized coating reagent on the article; and an outflow assembly to remove the gas mixture from the process chamber.

In another aspect, the invention is directed to a method of forming a coating on a surface of an article placed in a process chamber. The method includes providing a liquid coating reagent in a flow passageway extending into the process chamber; flowing a carrier gas through the flow passageway to produce a gas mixture including a vaporized coating reagent and the carrier gas; directing the gas mixture into the process chamber; and depositing the vaporized coating reagent on the surface of the article to form a coating thereon.

In yet another aspect, the invention is directed to a method of forming a coating on a surface of an article wherein, the method includes placing a porous article between an upper housing portion and a lower housing portion of a process chamber. The article spans a cross-section of the process chamber and the upper housing portion is sealed to the lower housing portion. A liquid coating reagent is introduced into a flow passageway extending into the process chamber, and a carrier gas is flowed through the flow passageway to produce a gas mixture including a vaporized coating reagent and the carrier gas. This gas mixture is directed into the process chamber to contact the article and form a coating thereon. The gas mixture is then exhausted from the process chamber.

Features of the just described method include the following. The carrier gas is flowed through the flow passageway before introducing the liquid coating reagent in the flow passageway. The flow rate of the carrier gas is measured to provide a first flow rate. After the gas mixture has been exhausted from the process chamber, the flow rate of the carrier gas is measured again to provide a second flow rate. The first flow rate is compared to the second flow rate to determine if the coating procedure has been performed successfully.

Advantages of the invention include the following. The coating has a surface that is extremely smooth and without any detectable submicron aggregates. A uniform coating of about 1 nanometer (nm) in thickness can be consistently achieved. Use of the invention is particularly advantageous whenever it is necessary to coat irregular shapes or channels in microdevices. No solvent is needed in the coating step. The invention is applicable to a wide range of surfaces, including silicon based surfaces, glass based surfaces and metal oxide based surfaces.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

FIG. 1 shows a schematic diagram of a coating apparatus according to the present invention.

FIG. 2 shows an inner chamber of a coating apparatus including a platform.

FIG. 3 shows the inner chamber of a coating apparatus including a raised holder.

FIG. 4 shows the inner chamber and an input tube which has a coiled part with a depression for storing a coating reagent.

FIG. 5 shows the inner chamber and an input tube which has a pocket for storing a coating reagent.

FIG. 6 shows an inner chamber having an upper housing section and a lower housing section.

DESCRIPTION

FIG. 1 shows an apparatus 50 for performing vapor phase deposition according to the present invention. The apparatus includes an outer chamber 100, an inner or process chamber 200 wherein an article to be coated is placed, an inflow assembly 300 which introduces a carrier gas and a coating reagent into the inner chamber, and an outflow assembly 400 which exhausts the inner chamber. The inner chamber, the inflow assembly and the outflow assembly are made of a material that is resistant to chemical attacks, such as Teflon®, because the coating reagent is a highly active chemical.

The outer chamber 100 encloses the inner chamber 200. Although the outer chamber and the inner chamber are shown as having a rectangular shape in FIG. 1, they may alternatively be cylindrical in shape. The outer chamber 100 defines an enclosed space with a minimum of openings to provide a stable, insulated environment in which the process chamber is located.

The inner chamber 200 includes a bottom wall 202, side walls 204, a top wall 206, an inlet 210, and an outlet 220. The inlet 210 is provided at the top wall 206, and the outlet 220 is provided at the bottom wall 202. The inlet 210 is coupled to a first end 312 of an input tube 310 of the inflow assembly 300, which serves as a passage for introducing the carrier gas into the inner chamber 200. (The structure of the input tube 310 will be explained in more detail below.) The outlet 220 of the inner chamber 200 is coupled to an end 412 of an output tube 410 of the output assembly 400 to exhaust the inner chamber 200. The output tube 410 extends from the outlet 220 and passes through the outer chamber 100 via a bottom opening 120 of the outer chamber 100. The opposing end of the output tube 410 is coupled to a vacuum pump 420 to exhaust the inner chamber. In an alternative embodiment, the output assembly does not include a vacuum pump, in which case the inner chamber 200 is exhausted by diffusion.

The inner chamber 200 may further include a base 230 at the bottom wall 202. The base 230 may be placed over the outlet 220, substantially covering the outlet. An article 60, such as a silicon wafer or a glass substrate, may be placed on the base 230 for coating. The base 230 may be a porous material to allow the carrier gas to flow therethrough and exit the inner chamber 200 via the outlet 220.

Alternatively, as shown in FIG. 2, the inner chamber may include a platform 232 provided above the bottom wall 202, on which the article 60 may be placed. In yet another embodiment, as shown in FIG. 3, the inner chamber 220 may include a raised holder 234 provided above the bottom wall 202 to hold the sides or edges of the article 60 during the coating process.

Referring back to FIG. 1, the inflow assembly 300 includes the input tube 310, a carrier gas supply 320 and a coating reagent supply 330. The coating reagent supply 330 contains a coating reagent, such as an alkyltrichlorosilane or alkyltrimethoxysilane, in liquid form. The carrier gas supply 320 is connected to the input tube 310 through a desiccant tube 340 and a flow meter 350. The carrier gas supply 320 contains an inert gas, such as nitrogen or argon, which will not react with the coating reagent. The desiccant tube 340 dries the carrier gas to substantially eliminate moisture from it. The flow meter 350 measures the carrier gas flow rate.

The input tube 310 has three ports or channels. As explained above, the first port 312 is coupled to the inlet 210 of the inner chamber 200. A second port 314 is connected to the carrier gas supply 320, and a third port 316 is connected to the coating reagent supply 330.

The input tube 310 additionally includes a storage region 318 located between the port 312, and the ports 314 and 316 to hold a liquid coating reagent 52 which is fed into the input tube 310 via the third port 316 from the carrier reagent supply 330.

The storage region 318 may have various forms. As shown in FIG. 1, the input tube 310 can include a coiled portion 310a with a bottom part 311a functioning as the storage region 318. In this embodiment, the liquid coating reagent 52 occupies no more than half the diameter of the input tube 310 to provide the carrier gas with sufficient space to flow through the input tube.

Alternatively, as shown in FIG. 4, a coiled portion 310b of the input tube 310' may have a depression 311b which serves as the storage region 318'. Also, as shown in FIG. 5, the input tube 310" may comprise a curved tube 310c including a pocket 311c which forms the storage region 318".

As shown in FIG. 1, the outer chamber 100 includes heating coils 130 joined to its inner walls. The heating coils can be used as a secondary drying mechanism in addition to the desiccant tube 340 to ensure that the carrier gas flowing through the input tube 310 is substantially moisture free. The heating coils are connected to a thermal-couple or a thermal-set (not shown) such that their temperature can be controlled electrically. The temperature within the outer chamber 100 is usually maintained below the boiling point of the coating reagent 52 to prevent rapid evaporation of the coating reagent in the storage region 318.

The heating coils 130, as shown, may be wound more closely together at the bottom of the outer chamber 100, where the inner chamber 200 is located, to provide a slightly higher temperature within the inner chamber than at the top of the outer chamber where the inflow assembly 300 is located. This temperature gradient prevents vapor condensation on the article 60, such as capillary condensation in small channels of porous articles, such as silicon filters.

A coating operation which may be carried out in the coating apparatus 50 will now be described. The article 60, such as a silicon wafer, having the dimensions of 1×2 cm (centimeters) is cleaned in 2:1 sulfuric acid and 30% hydrogen peroxide (piranha) at 80° C. for 20 minutes. Then the article is rinsed with deionized water and transferred into the inner chamber 200. A carrier gas, such as nitrogen, from the carrier gas supply 320 is passed through the desiccant tube 340 to dry the carrier gas. The carrier gas is then directed into the inner chamber 200 where it is heated by the heating coils. After about 10–15 minutes of flowing the carrier gas, the article 60 becomes substantially moisture free and only hydroxyl groups bonded to the article remains. The hydroxyl groups bonded to the article are referred as silanol groups.

Then about 0.1 to 0.4 ml (milliliters) of a liquid coating reagent, such as alkyltrimethoxysilane, is injected into the port 316 of the input tube 310 from the coating reagent supply 330. The liquid coating reagent flows through the input tube 310 and is held in the storage region 318. As noted, the temperature within the outer chamber 100 is maintained below the boiling point of the coating reagent so it is in a liquid form in the storage region 318 for sufficient time to complete the coating process. Even at a temperature below the boiling point, trace amounts of the liquid coating reagent are vaporized. The vaporized coating reagents form a gas mixture with the flowing carrier gas and is directed into the inner chamber 200. Eventually all available coating reagent is vaporized. Typically, 0.1 to 0.4 ml of liquid coating reagent takes about 20–30 minutes to completely evaporate.

The vaporized coating reagent carried into the inner chamber 200 reacts with the silanol groups on the surface of the silicon wafer and generally forms a monolayer coating. Once all the silanol groups react with the coating reagent and the monolayer coating has been formed, the coating thickness does not increase appreciably even when continuously exposed to the coating reagent since there is no hydroxyl groups to react with the coating reagent. Eventually all of the coating reagent in the storage region is carried away by the carrier gas and flushed out through the outlet 220. If there had been excess hydroxyl groups in addition to the silanol groups, i.e., trace amounts of water on the wafer, the coating reagent would have reacted with the excess hydroxyl groups and formed aggregate or multilayers on the article.

Therefore, if baking is used to dry the article 60 rather than a gas, care must be taken not to over bake the article. Over baking would the eliminate the hydroxyl groups bonded to the surface of the article in the form of silanol groups, causing a shortage of hydroxyl groups needed for the coating process.

During the coating operation above, the heating coils 130 of the outer chamber 100 maintain a slight temperature gradient at the bottom of the outer chamber where the inner chamber is located. The temperature in the inner chamber 200 is maintained at about 10° C. higher than the top of the outer chamber where the input tube 310 of the input assembly is located. This temperature gradient prevents vapor condensation in the inner chamber 200.

In the embodiment of FIG. 6, the outer chamber 100, the inflow assembly 300, and the outflow assembly 400 are substantially the same as in FIG. 1, and thus, they are not shown in FIG. 6. This embodiment of a coating apparatus 50' may be used for coating a porous article, such as a silicon filter 64 including micro-channels. The inner chamber 200' having a rectangular shape is formed by joining together an upper clamp member 270 and a lower clamp member 272. In another embodiment, the inner chamber 200' has a cylindrical shape. The upper clamp member 270 includes a first cavity 274, a first inner wall 276, and a first outer wall 278. The upper clamp member 270 further includes an inlet 210' extending between the first inner wall 276 and the first outer wall 278.

The lower clamp member 272 includes a second cavity 280, a second inner wall 282 and a second outer wall 284. The lower clamp member 272 further includes an outlet 220' extending between the second inner wall 282 and the second outer wall 284. A plurality of bolts 275 are used to join the upper and lower clamp members 270 and 272. The bolts 274 are provided at each corner of the clamp members 270 and 272.

The silicon filter 64 is placed on the lower clamp member 272 over the second cavity 280. The silicon filter is sufficiently large to span the first and second cavities 274 and 280. A sealant 286, such as O-rings, is placed on the outer periphery of the silicon filter and on the upper surface of the lower clamp member 272. The upper clamp member 270 is joined to the lower clamp member 272, with the first and second cavities 274 and 280 being aligned. The bolts are tightened and the sealant seals the first and second cavities, forming the inner chamber 200' which is hermetically sealed except for the inlet 210' and the outlet 220'.

A gas mixture, including a carrier gas and a vaporized coating reagent, is directed into the inner chamber 200' through the inlet 210'. The carrier gas and the coating reagent fill the inner chamber and form a monolayer coating on the surfaces of the silicon filter 64, including the micro-channels of the silicon filter.

Since the silicon filter is placed between the inlet 210' and the outlet 220', the carrier gas and the coating reagent must pass through the silicon filter to exit the inner chamber. This provides a convenient way of determining whether the coating operation has been performed properly. If properly performed, the coating would not block the channels of the silicon filter so that the gas flow rate before and after the coating procedure should be substantially similar. On the other hand, if the coating procedure has been improperly performed and the channels are blocked, the flow rate after the procedure would be substantially less than the flow rate before the procedure. Therefore, the success of the coating procedure may be determined by measuring the flow rate of the carrier gas through the silicon filter using the flow meter 350 before and after the coating operation and comparing the two flow rates. This test could be implemented as part of the coating operation simply by coupling the flow meter 350 to the coating apparatus 50'.

While the invention has been shown and described with reference to an embodiment thereof, those skilled in the art will understand that the above and other changes in form and detail may be made without departing from the spirit and scope of the following claims.

What is claimed is:

1. A method of forming a coating on a surface of an article, comprising:

placing a porous article between an upper housing portion and a lower housing portion of a process chamber, the article spanning a cross-section of the process chamber;

joining the upper housing portion and the lower housing portion;

introducing a liquid coating reagent into a flow passageway extending into the process chamber;

flowing a carrier gas through the flow passageway to produce a gas mixture including a vaporized coating reagent and the carrier gas;

directing the gas mixture into the process chamber to contact the surface of the article and form the coating thereon; and exhausting the gas mixture from the process chamber.

2. The method of claim 1, further including:

flowing the carrier gas through the flow passageway before introducing the liquid coating reagent into the flow passageway and measuring the flow rate of the carrier gas to provide a first flow rate;

as the gas mixture is exhausted from the process chamber, measuring its flow rate to provide a second flow rate; and comparing the first flow rate to the second flow rate to determine if the coating procedure has been performed properly.

3. A method of forming a coating on a surface of an article, comprising:

placing a porous article between an upper housing portion and a lower housing portion of a process chamber, the article extending across a cross-section of the process chamber;

flowing a carrier gas through a flow passageway extending into the process chamber and measuring the flow rate of the carrier gas exiting the process chamber to provide a first flow rate;

introducing a liquid coating reagent into the flow passageway extending into the process chamber;

flowing the carrier gas through the flow passageway to produce a gas mixture including a vaporized coating reagent and the carrier gas;

directing the gas mixture into the process chamber to contact the surface of the article and form the coating thereon;

exhausting the gas mixture from the process chamber and measuring its flow rate to provide a second flow rate; and comparing the first flow rate to the second flow rate to determine if the coating procedure has been performed properly.

* * * * *